(12) United States Patent
Mitta et al.

(10) Patent No.: US 8,783,174 B2
(45) Date of Patent: Jul. 22, 2014

(54) SCREEN PRINTING METHOD

(75) Inventors: Ryo Mitta, Annaka (JP); Hiroyuki Otsuka, Annaka (JP); Ikuo Sakai, Annaka (JP); Kenji Abe, Annaka (JP); Naoki Ishikawa, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 880 days.

(21) Appl. No.: 12/702,695

(22) Filed: Feb. 9, 2010

(65) Prior Publication Data
US 2010/0229740 A1 Sep. 16, 2010

(30) Foreign Application Priority Data
Feb. 10, 2009 (JP) .................................. 2009-028072

(51) Int. Cl.
*B41M 1/12* (2006.01)
*B41F 15/08* (2006.01)

(52) U.S. Cl.
USPC ............................ 101/129; 101/481; 101/126

(58) Field of Classification Search
USPC .................. 101/114, 129, 481, 485, 486, 126
See application file for complete search history.

(56) References Cited

U.S. PATENT DOCUMENTS

| | | | | |
|---|---|---|---|---|
| 4,516,495 A | * | 5/1985 | Ericsson | 101/129 |
| 4,610,200 A | * | 9/1986 | Metso | 101/126 |
| 5,176,078 A | | 1/1993 | Homma et al. | |
| 6,689,951 B2 | | 2/2004 | Shimizu et al. | |
| 2005/0194037 A1 | | 9/2005 | Asai | |
| 2009/0199729 A1 | * | 8/2009 | Aiba | 101/129 |
| 2010/0032014 A1 | | 2/2010 | Bettinelli et al. | |

FOREIGN PATENT DOCUMENTS

| | | |
|---|---|---|
| DE | 10 2004 048 680 A1 | 5/2005 |
| JP | 04-140186 A | 5/1992 |
| JP | 8-192337 A | 7/1996 |
| JP | 09-226224 A | 9/1997 |
| JP | 11-000986 A | 1/1999 |
| JP | 2000-246880 A | 9/2000 |
| JP | 2003-037277 A | 2/2003 |
| JP | 2004-122714 A | 4/2004 |
| JP | 2006-080415 A | 3/2006 |
| JP | 2007-196521 A | 8/2007 |
| JP | 2008-105400 A | 5/2008 |
| JP | 2008-179029 A | 8/2008 |
| WO | WO 2008007744 A1 * | 1/2008 |
| WO | WO 2008/125446 A2 | 10/2008 |

OTHER PUBLICATIONS

EPO Search Report, Appl. No. 10250225.9, May 19, 2010, pp. 1-7.
Japanese Office Action mailed Dec. 19, 2012.
Japanese Office Action from corresponding Japanese Application No. 2010-025047 mailed Jul. 16, 2013.

* cited by examiner

*Primary Examiner* — Leslie J Evanisko
(74) *Attorney, Agent, or Firm* — Birch, Stewart, Kolasch & Birch, LLP

(57) ABSTRACT

The method for screen printing improves accuracy during a plurality of screen printing steps. After a first layer and an alignment mark are printed on a workpiece, the alignment mark is imaged by a camera so that the alignment mark is stored as image data in an image processing device adapted to deliver reference data for subsequent printing, and the image data is used to renew the reference data in the image processing device.

9 Claims, 3 Drawing Sheets

A0  B0

A1  B1

A2  B2

SCREEN PRINTING METHOD

CROSS-REFERENCE TO RELATED APPLICATION

This non-provisional application claims priority under 35 U.S.C. §119(a) on Patent Application No. 2009-028072 filed in Japan on Feb. 10, 2009, the entire contents of which are hereby incorporated by reference.

TECHNICAL FIELD

This invention relates to a screen printing method, and more particularly, to a screen printing method employing an alignment mode for registration of printed patterns.

BACKGROUND ART

Solar cells are desired to have electrodes with a high aspect ratio. The desired electrode may be formed by screen printing an electrode paste to form a first electrode layer, and repeating screen printing to lay plural electrode layers thereon. This method is known as multilayer electrode printing. To carry out accurate multilayer electrode printing, alignment marks are utilized as shown in FIGS. 1A-1C Alignment marks are formed on a wafer or workpiece subject to printing as shown in FIG. 2. Specifically, FIG. 2 illustrates an exemplary solar cell having two alignment marks. Disposed on a semiconductor substrate 11 are finger electrodes 12, bus bar electrodes 13, and alignment marks 14. First, the shape and location of initial alignment marks (A0, B0 in FIG. 1A) are previously stored in an image processing device. Secondly, alignment marks (A1, B1 in FIG. 1B) of the same shape as the initial alignment marks are printed on the substrate at the same time as is a first layer of electrode. Thirdly, the workpiece having marks A1, B1 printed is placed on a stage for printing second and subsequent layers of electrode. Fourthly, marks A1, B1 are recognized by cameras, and the stage position is finely adjusted so that marks A1, B1 may overlay the positional data of marks A0, B0 of the same shape. Thereafter, electrode paste is printed. In this way, a multilayer electrode can be formed.

While printing is repeated, there can occur changes in viscosity of the electrode paste or fissure of the workpiece, whereupon accurate alignment marks are no longer printed. There result alignment marks A2 and B2 in FIG. 1C. Now that the difference in shape between the mark actually printed and the mark previously stored in the image processing device is of significance, accurate image processing becomes impossible. As a result, the lower layer of electrode and the overlying layer of electrode printed thereon are shifted to increase a shadow loss, detracting from the conversion of the solar cell.

JP-A 2006-080415, for example, addresses the problem in that alignment marks formed by screen printing are image processed for positional correction and observed for any anomaly at the same time. When an anomaly is detected, the process is interrupted. The method of JP-A 2006-080415, however, does not address changes of alignment marks with time (e.g., oozing due to lowering of paste viscosity, incidental flaws). Since the process is interrupted whenever an anomaly is detected in the mark, the down time is a problem.

CITATION LIST

Patent Document 1: JP-A 2006-080415

SUMMARY OF INVENTION

In an example wherein multilayer electrodes in solar cells are formed, as the difference in shape between a mark stored in an image processing device and a mark actually printed becomes of significance, accurate image processing becomes impossible. As a result, the lower layer of electrode and the overlying layer of electrode printed thereon are shifted to increase a shadow loss, resulting in the solar cell with reduced conversion.

An object of the invention is to provide a screen printing method capable of multilayer printing at a high accuracy while facilitating registration.

Accordingly, the present invention provides a screen printing method defined below.

[1] A method for improving accuracy during a plurality of screen printing steps, wherein after a first layer to be printed and an alignment mark are printed on a workpiece, the alignment mark is imaged by a camera so that the alignment mark is stored as image data in an image processing device adapted to deliver reference data for subsequent printing, and the image data is used to renew the reference data in the image processing device.

[2] The screen printing method of [1] wherein the alignment mark is of such shape that a ratio of the total length of sides of a rectangle that circumscribes the outermost periphery of the alignment mark to the total length of outer sides of the alignment mark itself is from 1:0.1 to 1:50.

[3] The screen printing method of [1] or [2] wherein the alignment mark is of T, crisscross, rectangular, triangular, elliptic or semi-circular shape.

[4] The screen printing method of any one of [1] to [3] wherein at least two alignment marks are printed on the workpiece and used for image processing.

[5] The screen printing method of any one of [1] to [4] wherein the frequency of renewing the reference data with the alignment mark image data is every 1 to 5,000 printing steps.

[6] The screen printing method of any one of [1] to [5] wherein the layer printed constitutes an electrode of a solar cell.

[7] The screen printing method of [6] wherein the workpiece is a wafer of a solar cell on which an electrode pattern is printed as the first layer, and at least one more layer of electrode pattern is printed to form an electrode of multilayer structure while the alignment mark printed at the same time as the first layer is used as a registration reference on the side of the workpiece, and the alignment mark printed at the same time as the first layer or any alignment mark printed within 5,000 printing steps at maximum is used as a registration reference on the side of the image processing device.

[8] The screen printing method of [6] or [7] wherein the solar cell has the first layer of finger electrode pattern, and the alignment mark is formed utilizing a part of the first layer of finger electrode pattern.

[9] The screen printing method of any one of [1] to [8] wherein a part of printed pattern is utilized as the alignment mark so that no partition is defined between the alignment mark and the printed pattern, and all the region viewed by the camera is fed as the alignment mark image data to the image processing device.

Advantageous Effects of Invention

The screen printing method of the invention ensures the accuracy and ease of multilayer screen printing.

DESCRIPTION OF EMBODIMENTS

In the method for improving accuracy during a plurality of screen printing steps according to the present invention; the method uses a system comprising a camera for producing image data, and an image processing device for storing image data and for delivering reference data for printing; a first layer and an alignment mark are printed on a workpiece, the alignment mark is then imaged by the camera to produce image data, the alignment mark image data is stored in the image processing device where the reference data is renewed with the image data, and second and subsequent layers are printed using the renewed reference data. A workpiece having a plurality of layers printed is formed by screen printing a first layer and an alignment mark on a workpiece, then screen printing second and subsequent layers. The workpiece is positioned such that the alignment mark actually printed on the workpiece may coincide with the alignment mark previously stored in an image processing device as the reference image, after which the steps of screen printing second and subsequent layers are carried out. The invention intends to improve the accuracy of a plurality of screen printing steps. According to the invention, after a first layer and an alignment mark are printed on a workpiece, the alignment mark is imaged by a camera so that the alignment mark is stored as image data in an image processing device adapted to deliver reference data for subsequent printing, and the alignment mark image data is used to renew the reference data in the image processing device.

The invention is advantageous when electrodes of solar cells are formed by the screen printing process. A first layer of electrode and an alignment mark are printed on a substrate. When the substrate goes past an appearance inspection apparatus, the alignment mark is imaged by a camera so that the alignment mark is stored as (a set of) image data in an image processing device. The image data is used to renew the reference data in the image processing device, which deliver the renewed reference data for subsequent printing. Then, positional adjustment of the printer stage and multilayer electrode formation can be performed independent of any change with time of alignment marks actually printed. In this way, the invention overcomes any change with time or anomaly of alignment mark.

Figure 1A:
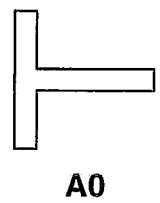
FIGS. 1A-1C illustrate different examples of alignment marks, FIG. 1A showing alignment marks previously stored as the reference image in an image processing device, FIG. 1B showing alignment marks actually printed, and FIG. 1C showing alignment marks which are deformed as a result of repeated printing.
Figure 1A:
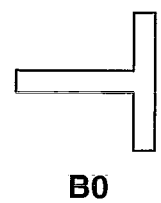
Figure 1B:
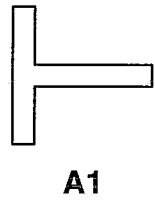
Figure 1B:
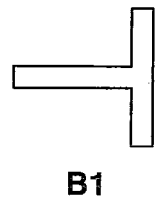
Figure 1C:
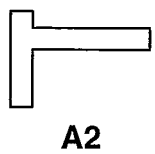
Figure 1C:
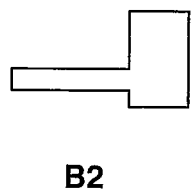
Figure 2:
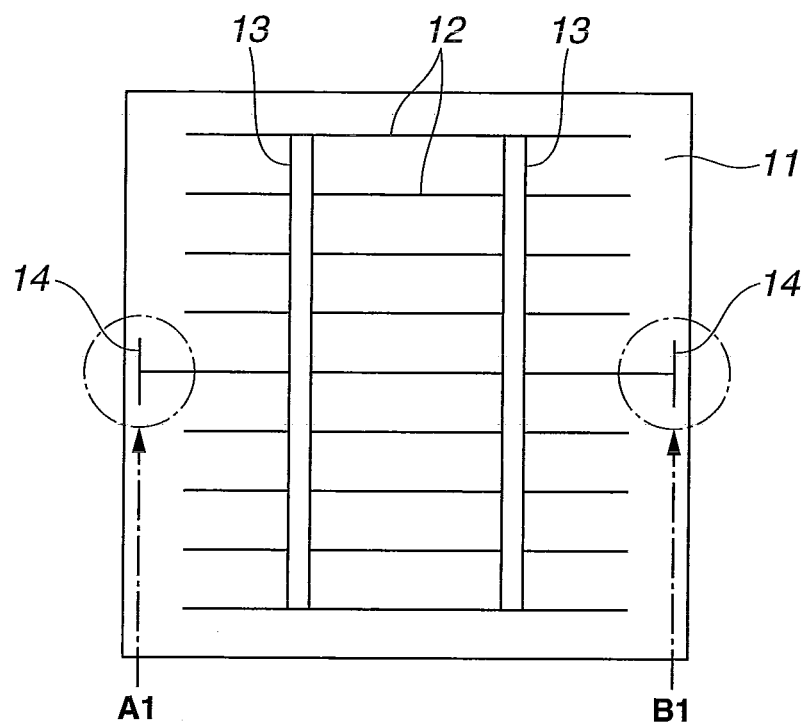
FIG. 2 is a plan view of a solar cell substrate on which electrodes and alignment marks are printed.
Figure 3:
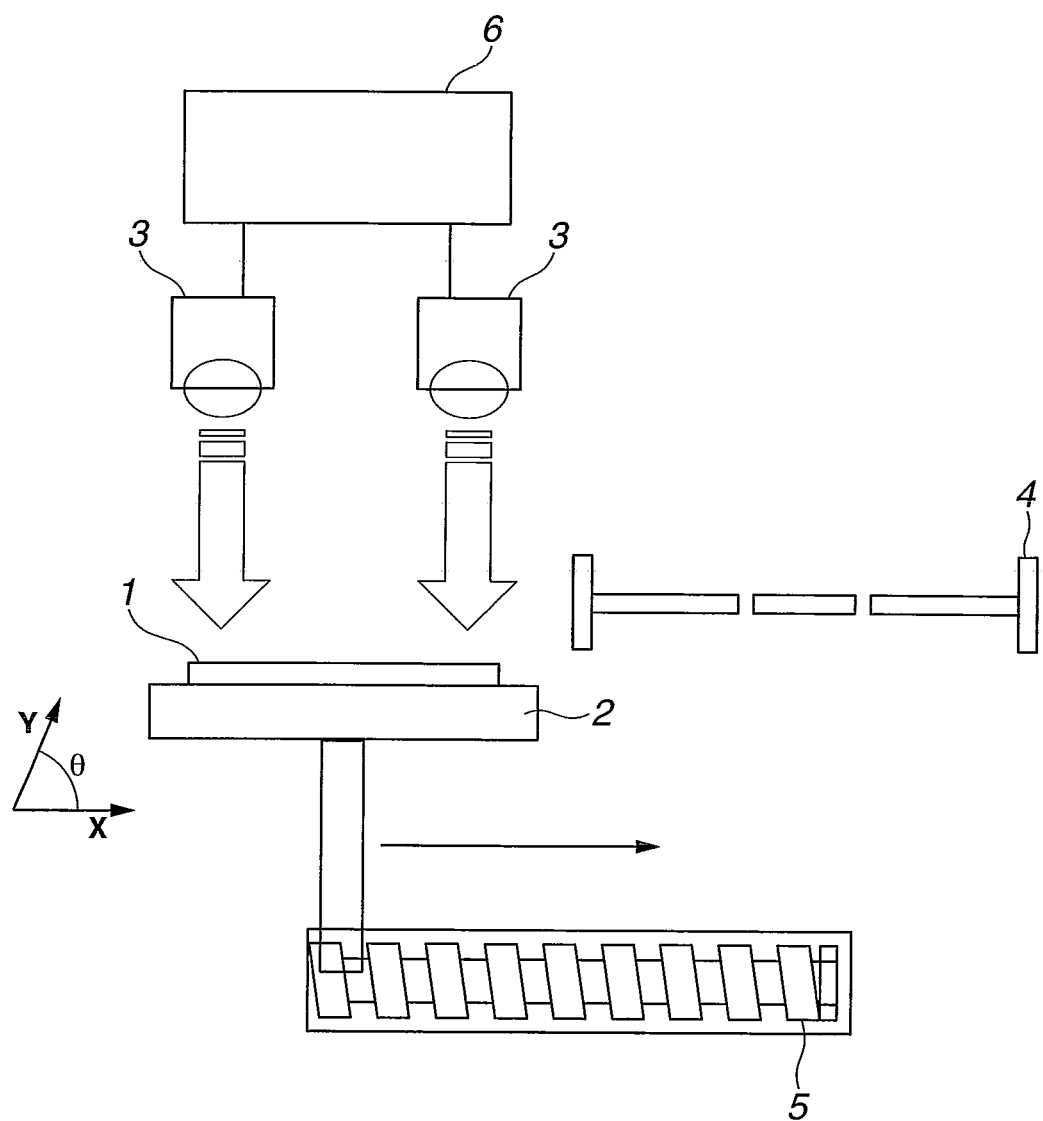
FIG. 3 schematically illustrates a screen printing system.

Referring to the drawings, one embodiment of the alignment method according to the invention is described. FIG. 2 shows the light-receiving surface of a solar cell having alignment marks 14 and 14. FIG. 1 is an enlarged view of two alignment marks on the solar cell. FIG. 3 schematically illustrates a screen printing system for forming multilayer electrodes on the solar cell. Illustrated in FIG. 3 are a workpiece 1, a movable stage 2 which are movable in X, Y and θ, stationary cameras 3 disposed above the stage 2 for recognizing alignment marks printed on the workpiece 1, a fixed screen 4, a ball screw 5 for moving the stage 2 to immediately below the screen 4, and an image processing device 6. Beforehand, the shape and position data of alignment marks A0, B0 in FIG. 1a is stored in the image processing device 6 as the reference image. The position (X, Y, θ) of the stage is finely adjusted so that alignment marks A1, B1 in FIG. 1b actually printed as an identical pattern on the workpiece 1 at the same time as the first layer of electrode may overlap the initial alignment marks A0, B0 within a certain tolerance. After the completion of fine adjustment, second and subsequent layers of electrode paste are printed.

If alignment marks A0, B0 stored beforehand in the image processing device as the reference image and alignment marks A1, B1 actually printed in an identical pattern on the workpiece at the same time as the first layer of electrode are approximate in shape, high accuracy printing is possible. However, as printing operation is repeated, some changes occur, for example, the electrode paste changes its viscosity, some openings of the screen are clogged, or the workpiece is fissured. Then the shape of alignment marks A1, B1 is changed, resulting in alignment marks A2, B2 as shown in FIG. 1c. As such, the difference in shape between alignment marks A0, B0 and alignment marks A2, B2 is too large, inhibiting accurate adjustment of the stage position. This reduces the position accuracy of printing second and subsequent layers of electrode. The following mechanism addresses the inaccurate positioning.

After a first layer of electrode pattern and an alignment mark are printed on a substrate, the substrate is moved past an appearance anomaly inspection apparatus prior to printing of second and subsequent layers of electrode pattern. In the inspection apparatus, the first layer of electrode is inspected for thickening, disconnection, contamination or the like. At the same time as appearance anomaly inspection, the alignment mark actually printed on the workpiece is imaged by a camera, and the resultant shape data is stored in the image processing device. The shape data is sequentially overwritten for use as alignment marks A0, B0, thereby reducing the difference in shape between alignment marks A0, B0 previously stored as the reference image in the image processing device and alignment marks A1, B1 actually printed on the workpiece in the identical pattern at the same time as the first layer. As a result, the position accuracy is maintained during a long period of multilayer electrode printing.

Ideally, when the first layer and alignment marks are printed on the workpiece, the workpiece and alignment marks are given ID number. When the workpiece with the relevant ID number is subjected to second printing, the alignment marks are read out and image processed. However, when the alignment marks are overwritten, a time of about 0.05 to 0.10 second is necessary for the processing. Thus, if the frequency of renewal is every layer, the tact time increases. Accordingly a compromise may be found between manufacturing yield and tact time if the frequency of overwriting alignment marks in the image processing device is every 5,000 layers or less. Namely, alignment marks are renewed in the image processing device every 1 to 5,000 printing steps, more preferably every 1 to 3,000 printing steps, and even more preferably every 1 to 1,000 printing steps.

A higher accuracy is expected when the number of alignment marks is two or more.

The shape of alignment marks may be T shape as shown in FIG. 1, or any of other various shapes including crisscross, rectangular, triangular, elliptic and semi-circular shapes. The invention is applicable independent of the shape of alignment marks.

Also preferably, the alignment mark is of such shape that a ratio of the total length of sides of a rectangle that circumscribes the outermost periphery of the alignment mark to the total length of outer sides of the alignment mark itself is from 1:0.1 to 1:50, more preferably 1:0.5 to 1:20, most preferably 1:0.6 to 1:10, especially 1:0.8 or 1.1. To increase the registration accuracy based on alignment, the alignment mark is of a shape identifiable by image processing, but sensitive to a change in the course of plural printing steps. As a countermeasure for the accuracy of registration based on alignment and a shape change of alignment mark in the course of plural printing steps, the alignment mark is used to renew the reference data in the image processing device.

In one example where the alignment mark is a regular triangle having three sides with length "a", a rectangle having four sides with lengths "a" and √3a/2 circumscribes the triangle. In this example, a ratio of the total length of sides of a rectangle that circumscribes the outermost periphery of the alignment mark to the total length of outer sides of the alignment mark itself is (2+√3)a: 3a≈1:0.80.

The method of the invention is advantageously employed, in the manufacture of a solar cell, when finger electrodes and/or bus bar electrodes are formed as two or multiple layers by the screen printing technique as shown in FIG. 2.

Specifically, the workpiece is a wafer of a solar cell on which an electrode pattern is printed as the first layer. While the alignment mark printed at the same time as the first layer is used as a registration reference on the side of the workpiece, and the alignment mark printed at the same time as the first layer or any alignment mark printed within 5,000 printing steps at maximum is used as a registration reference on the side of the image processing device, at least one more layer of electrode pattern is printed to form an electrode of multilayer structure. In a preferred embodiment, the solar cell has the first layer of finger electrode pattern, and the alignment mark is formed utilizing a part of the first layer of finger electrode pattern. Then the alignment mark may be formed without increasing the shadow loss. In a further preferred embodiment, a part of printed pattern is utilized as the alignment mark so that no partition is defined between the alignment mark and the printed pattern, and all the region viewed by the camera is fed as the alignment mark image data to the image processing device.

Example

In the manufacture of a solar cell, finger electrodes are formed by multilayer screen printing in accordance with the method described in conjunction with FIGS. 1 to 3. In Example, the shape data is stored and overwritten for renewal in the image processing device every 1,000 layers of printing. In Comparative Example, such renewal was omitted. Table 1 tabulates the percent occurrence of appearance anomaly owing to any shift between the first layer and the second or subsequent layer. Comparison is made after about 30,000 layers are printed. The term "appearance anomaly" indicates that the width of electrode fingers becomes equal to or more than 150 μm. The time required for printing does not differ substantially between Example and Comparative Example.

TABLE 1

| Occurrence of appearance anomaly (%) | |
|---|---|
| Example | 0.40 |
| Comparative Example | 10.34 |

The screen printing method of Comparative Example is orthodox. As seen from Table 1, the screen printing method of the invention ensures accurate printing with minimized occurrence of appearance anomaly as compared with the orthodox method.

Japanese Patent Application No. 2009-028072 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A screen printing method which applies a plurality of screen printing steps to a workpiece to form plural layers thereon, comprising:
    printing a first layer and at least one alignment mark on a workpiece in a first screen printing step;
    imaging the at least one alignment mark printed on the workpiece using a camera;
    using an imaging processing device to compare the at least one printed alignment mark with stored alignment mark reference data to register the workpiece position for subsequent printing steps;
    storing the at least one alignment mark as alignment mark image data in the image processing device;
    renewing the stored alignment mark reference data in the image processing device by overwriting the stored alignment mark reference data with the alignment mark image data after a predetermined number of printing steps; and
    delivering the renewed alignment mark reference data for use in subsequent printing steps so as to improve accuracy of the printing during the plurality of screen printing steps.

2. The screen printing method of claim 1 wherein the alignment mark is of such shape that a ratio of a total length of sides of a smallest rectangle that circumscribes the outermost periphery of the alignment mark to a total length of outer sides of the alignment mark is from 1:0.1 to 1:50.

3. The screen printing method of claim 1 wherein the alignment mark is T-shaped.

4. The screen printing method of claim 1 further comprising;
    printing at least two alignment marks on the workpiece; and
    using the at least two alignment marks for image processing.

5. The screen printing method of claim 1 further comprising renewing the reference data with the alignment mark image data every 1 to 5,000 printing steps.

6. The screen printing method of claim 1 wherein the first layer constitutes an electrode of a solar cell.

7. The screen printing method of claim 6 wherein the workpiece is a wafer of a solar cell on which an electrode pattern is printed as the first layer, and
    further comprising:
    printing at least one more layer of electrode pattern to form an electrode of multilayer structure while the alignment mark printed at the same time as the first layer is used as a registration reference on the side of the workpiece, and
    using an alignment mark at the same time as the first layer or any alignment mark printed within 5,000 printing steps at maximum as a registration reference on the side of the image processing device.

8. The screen printing method of claim 6 wherein the solar cell has a first layer of a finger electrode pattern, and
    further comprising forming the alignment mark by utilizing a part of the first layer of the finger electrode pattern.

9. The screen printing method of claim 1 further comprising utilizing a part of printed pattern as the alignment mark so that no partition is defined between the alignment mark and the printed pattern, and feeding all the region viewed by the camera to the image processing device as the alignment mark image data.

* * * * *